US010685435B2

(12) United States Patent
Hara et al.

(10) Patent No.: US 10,685,435 B2
(45) Date of Patent: Jun. 16, 2020

(54) DRAWING DATA GENERATING METHOD

(71) Applicant: NuFlare Technology, Inc., Yokohama-shi (JP)

(72) Inventors: Shigehiro Hara, Kawasaki (JP); Kenichi Yasui, Kawasaki (JP); Noriaki Nakayamada, Kamakura (JP)

(73) Assignee: NuFlare Technology, Inc., Yokohama-shi (JP)

( * ) Notice: Subject to any disclaimer, the term of this patent is extended or adjusted under 35 U.S.C. 154(b) by 521 days.

(21) Appl. No.: 15/380,503

(22) Filed: Dec. 15, 2016

(65) Prior Publication Data
US 2017/0193650 A1 Jul. 6, 2017

(30) Foreign Application Priority Data

Jan. 5, 2016 (JP) ................................. 2016-000563

(51) Int. Cl.
*H01J 37/302* (2006.01)
*G06T 7/00* (2017.01)
(Continued)

(52) U.S. Cl.
CPC ............. *G06T 7/0004* (2013.01); *G06T 7/60* (2013.01); *G06T 7/70* (2017.01); *G06T 9/00* (2013.01);
(Continued)

(58) Field of Classification Search
CPC combination set(s) only.
See application file for complete search history.

(56) References Cited

U.S. PATENT DOCUMENTS 7,302,111 B2 * 11/2007 Olsson ...................... G03F 1/76
382/190
7,926,007 B2 * 4/2011 Shibata .................. B82Y 10/00
341/63
(Continued)

FOREIGN PATENT DOCUMENTS

JP 5-121303 5/1993
JP 10-229047 A 8/1998
(Continued)

OTHER PUBLICATIONS

Office Action dated Mar. 26, 2019 in Japanese Patent Application No. 2016-000563, 9 pages (with unedited computer generated English translation).
(Continued)

*Primary Examiner* — Tsung Yin Tsai
(74) *Attorney, Agent, or Firm* — Oblon, McClelland, Maier & Neustadt, L.L.P.

(57) ABSTRACT

A drawing data generating method according to an embodiment is a method for generating drawing data input to a drawing apparatus that draws a plurality of figure patterns on an object using a charged particle beam. The method includes generating the drawing data in accordance with a data format that not only defines a plurality of pieces of figure information, but also sequentially defines dose information of each figure before or after the plurality of pieces of figure information. The dose information of each of the second and succeeding figures is converted to a representation based on the dose information of any preceding figure, and a data length of the dose information is made variable for each figure. For example, the dose information of each of the second and succeeding figures is converted to a difference representation between a dose of the figure and a dose of the preceding figure, and a data length of the
(Continued)

difference representation is changed in accordance with the magnitude of a difference value.

13 Claims, 16 Drawing Sheets

(51) Int. Cl.
*G06T 9/00* (2006.01)
*H01J 37/317* (2006.01)
*H04N 19/423* (2014.01)
*G06T 7/70* (2017.01)
*G06T 7/60* (2017.01)

(52) U.S. Cl.
CPC ...... *H01J 37/3026* (2013.01); *H01J 37/3174* (2013.01); *H04N 19/423* (2014.11); *G06T 2207/30148* (2013.01); *H01J 2237/31762* (2013.01); *H01J 2237/31776* (2013.01)

(56) References Cited

U.S. PATENT DOCUMENTS

| | | | | |
|---|---|---|---|---|
| 8,429,573 | B2* | 4/2013 | Ogino | B82Y 10/00 430/196 |
| 2007/0114453 | A1* | 5/2007 | Emi | H01J 37/3174 250/492.2 |
| 2007/0187624 | A1* | 8/2007 | Suzuki | B82Y 10/00 250/492.22 |
| 2016/0284510 | A1* | 9/2016 | Hara | H01J 37/3026 |
| 2018/0060474 | A1* | 3/2018 | Hara | G06K 9/4647 |

FOREIGN PATENT DOCUMENTS

| | | |
|---|---|---|
| JP | 11-102853 | 4/1999 |
| JP | 2005-79115 A | 3/2005 |
| JP | 2012-129479 A | 7/2012 |
| JP | 2015-95538 | 5/2015 |
| JP | 2015-111195 | 6/2015 |
| KR | 10-2014-0137309 A | 12/2014 |

OTHER PUBLICATIONS

Combined Taiwanese Office Action and Search Report dated Mar. 21, 2018 in Taiwanese Patent Application No. 105141628 (with English translation of Category of Cited Documents), 5 pages.

Office Action dated Aug. 16, 2017 in Korean Patent Application No. 10-2017-0001834.

* cited by examiner

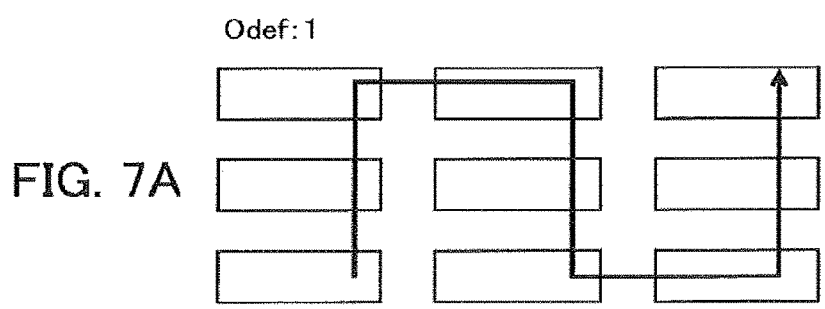
FIG. 7A
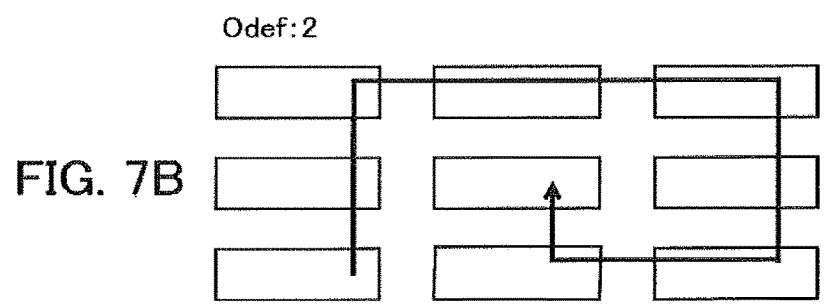
FIG. 7B
| | Before Compression | After Compression | | |
|---|---|---|---|---|
| | | Header | Value Portion | Number of Bits |
| j-th Figure Pattern | 808 | 00 | 808 | 12 |
| (j+1)-th Figure Pattern | 775 | 01 | -33 | 10 |
| (j+2)-th Figure Pattern | 765 | 10 | -10 | 8 |
| (j+3)-th Figure Pattern | 760 | 10 | -5 | 8 |
| (j+4)-th Figure Pattern | 760 | 11 | None | 2 |
FIG.8

|  | Before Compression | After Compression | | |
| --- | --- | --- | --- | --- |
|  |  | Header | Value Portion | Number of Bits |
| j-th Figure Pattern | 777 | 00 | 777 | 12 |
| (j+1)-th Figure Pattern | 757 | 10 | -20 | 8 |
| (j+2)-th Figure Pattern | 744 | 10 | -13 | 7 |
| (j+3)-th Figure Pattern | 735 | 01 | -9 | 7 |
| (j+4)-th Figure Pattern | 729 | 10 | -6 | 6 |
| (j+5)-th Figure Pattern | 719 | 11 | -10 | 7 |
| (j+6)-th Figure Pattern | 715 | 10 | -4 | 6 |
| (j+7)-th Figure Pattern | 715 | 10 | None | 2 |

FIG.14

|  | Before Compression | After Compression | | |
| --- | --- | --- | --- | --- |
|  |  | Header | Value Portion | Number of Bits |
| j-th Figure Pattern | 777 | 0 | 777 | 11 |
| (j+1)-th Figure Pattern | 757 | 1 | None | 1 |
| (j+2)-th Figure Pattern | 737 | 0 | 737 | 11 |
| (j+3)-th Figure Pattern | 726 | 1 | None | 1 |
| (j+4)-th Figure Pattern | 715 | 0 | 715 | 11 |
| (j+5)-th Figure Pattern | 715 | 1 | None | 1 |
| (j+6)-th Figure Pattern | 715 | 1 | None | 1 |
| (j+7)-th Figure Pattern | 715 | 1 | None | 1 |
| (j+8)-th Figure Pattern | 715 | 1 | None | 1 |
| (j+9)-th Figure Pattern | 715 | 0 | 715 | 11 |

FIG.15

| | Before Compression | After Compression | | |
|---|---|---|---|---|
| | | Header | Value Portion | Number of Bits |
| j-th Figure Pattern | 606 | 00 | 608 | 12 |
| (j+1)-th Figure Pattern | 595 | 10 | None | 2 |
| (j+2)-th Figure Pattern | 581 | 10 | None | 2 |
| (j+3)-th Figure Pattern | 565 | 00 | 566 | 12 |
| (j+4)-th Figure Pattern | 572 | 01 | +6 | 8 |
| (j+5)-th Figure Pattern | 573 | 01 | +1 | 8 |
| (j+6)-th Figure Pattern | 0 | 11 | None | 2 |
| (j+7)-th Figure Pattern | 0 | 11 | None | 2 |

FIG.20A

| Figure Number | Before Compression | After Compression | | |
|---|---|---|---|---|
| | | Header | Value Portion | Number of Bits |
| 1 | 13155 | 00 | 13155 | 12 |
| 2 | 13005 | 00 | 13005 | 12 |
| 3 | 13036 | 10 | +31 | 9 |
| 4 | 13215 | 00 | 13215 | 12 |
| 5 | 13065 | 00 | 13065 | 12 |
| 6 | 13096 | 10 | +31 | 9 |
| 7 | 13275 | 00 | 13275 | 12 |
| 8 | 13127 | 00 | 13127 | 12 |
| 9 | 13158 | 10 | +31 | 9 |

FIG.20B

| Figure Number | Before Compression | After Compression | | |
|---|---|---|---|---|
| | | Header | Value Portion | Number of Bits |
| 2 | 13005 | 00 | 13005 | 12 |
| 3 | 13036 | 10 | +31 | 9 |
| 5 | 13065 | 10 | +29 | 8 |
| 6 | 13096 | 01 | +31 | 8 |
| 8 | 13127 | 01 | +31 | 8 |
| 1 | 13155 | 01 | +28 | 8 |
| 9 | 13158 | 10 | +3 | 7 |
| 4 | 13215 | 00 | 13215 | 12 |
| 7 | 13275 | 10 | +60 | 9 |

| Figure Number | Before Compression | After Compression | | |
|---|---|---|---|---|
| | | Header | Value Portion | Number of Bits |
| 2 | 13005 | 00 | 13005 | 12 |
| 3 | 13036 | 10 | +31 | 9 |
| 5 | 13065 | 10 | +29 | 8 |
| 6 | 13096 | 01 | +31 | 8 |
| 8 | 13127 | 01 | +31 | 8 |
| 1 | 13155 | 01 | +28 | 8 |
| 9 | 13158 | 01 | +3 | 8 |
| 4 | 13215 | 11 | +57 | 9 |
| 7 | 13275 | 01 | +60 | 9 |

FIG.21

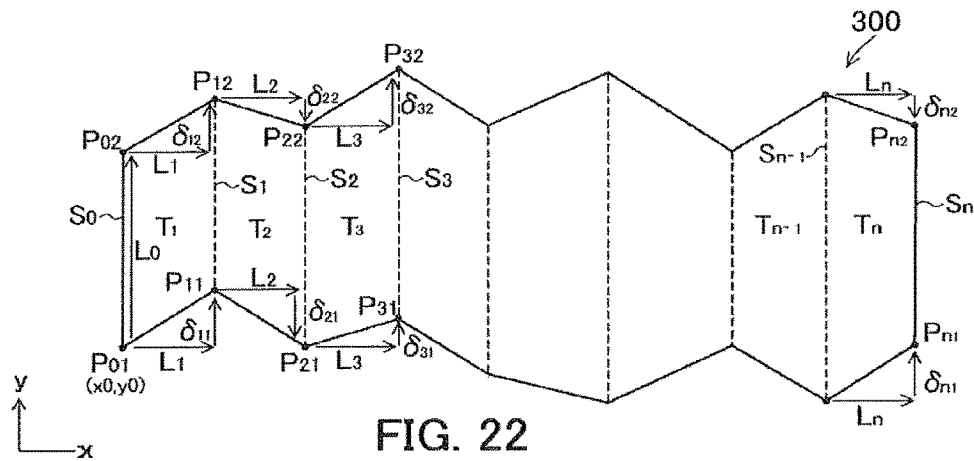
FIG. 22
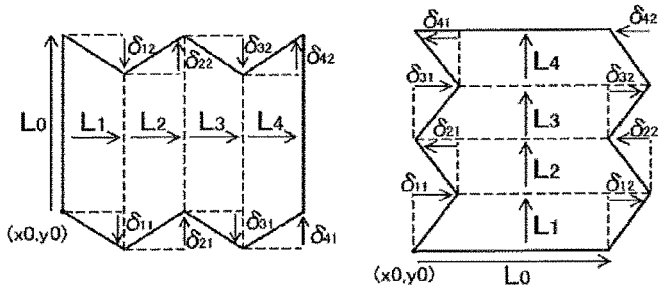
FIG. 23A  FIG. 23B
FIG. 23C
| PH | Code |
| | flag |
| | N |
| PHd | Code \| flag \| N |
| | AI$_1$ |
| | AI$_2$ |
| | AI$_3$ |
| | AI$_4$ |
| | Padding |
| EP | x0 |
| | y0 |
| | L0 |
| | 4(=Nconnect) |
| | L1 |
| | $\delta_{11}$ |
| | $\delta_{12}$ |
| | L2 |
| | $\delta_{21}$ |
| | $\delta_{22}$ |
| | L3 |
| | $\delta_{31}$ |
| | $\delta_{32}$ |
| | L4 |
| | $\delta_{41}$ |
| | $\delta_{42}$ |

FIG. 24A
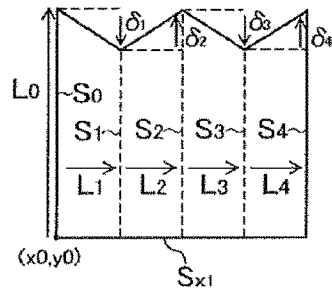
FIG. 24B
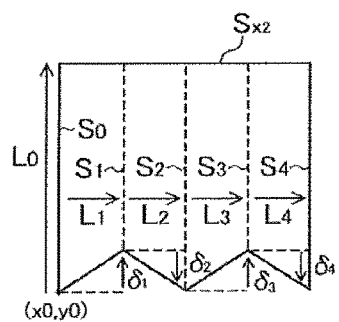
FIG. 24C
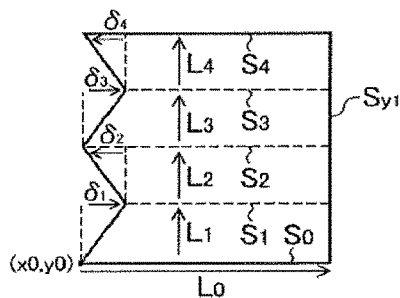
FIG. 24D
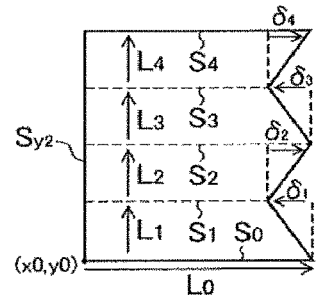
FIG. 24E
| PH | Code |
|---|---|
| | flag |
| | N |
| PHd | Code\|flag\|N |
| | $AI_1$ |
| | $AI_2$ |
| | $AI_3$ |
| | $AI_4$ |
| | Padding |
| EP | x0 |
| | y0 |
| | L0 |
| | 4(=Nconnect) |
| | $L_1$ |
| | $\delta_1$ |
| | $L_2$ |
| | $\delta_2$ |
| | $L_3$ |
| | $\delta_3$ |
| | $L_4$ |
| | $\delta_4$ |

FIG. 25A
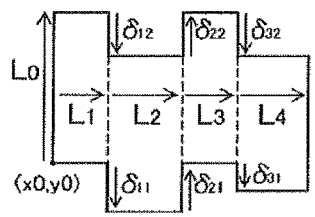
FIG. 25B
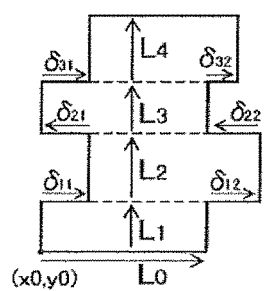
FIG. 25C
| PH | Code |
|---|---|
| | flag |
| | N |
| PHd | Code \| flag \| N |
| | Al$_1$ |
| | Al$_2$ |
| | Al$_3$ |
| | Al$_4$ |
| | Padding |
| EP | x0 |
| | y0 |
| | L0 |
| | 4(=Nconnect) |
| | L1 |
| | $\delta_{11}$ |
| | $\delta_{12}$ |
| | L2 |
| | $\delta_{21}$ |
| | $\delta_{22}$ |
| | L3 |
| | $\delta_{31}$ |
| | $\delta_{32}$ |
| | L4 |
FIG. 26A
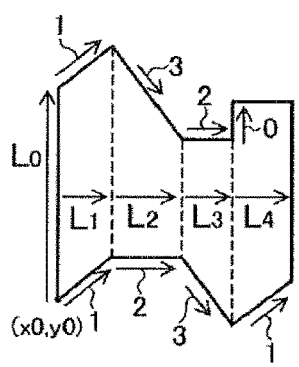
FIG. 26B
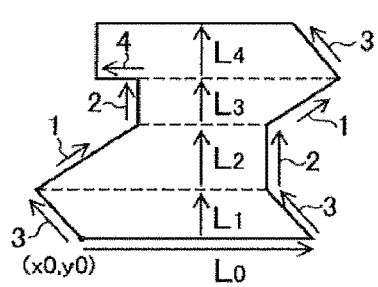

| PH | Code |
| --- | --- |
| | flag |
| | N |
| PHd | Code \| flag \| N |
| | AI₁ |
| | AI₂ |
| | AI₃ |
| | AI₄ |
| | Padding |
| EP | x0 |
| | y0 |
| | L0 |
| | 4(=Nconnect) |
| | L1 |
| | 1(=DIRECTION FLAG) |
| | 1(=DIRECTION FLAG) |
| | L2 |
| | 2(=DIRECTION FLAG) |
| | 3(=DIRECTION FLAG) |
| | L3 |
| | 3(=DIRECTION FLAG) |
| | 2(=DIRECTION FLAG) |
| | L4 |
| | 1(=DIRECTION FLAG) |
| | 0(=DIRECTION FLAG) |

FIG. 27A

| PH | Code |
| --- | --- |
| | flag |
| | N |
| PHd | Code \| flag \| N |
| | $AI_1$ |
| | $AI_2$ |
| | ⋮ |
| | $AI_n$ |
| | パディング |
| EP | x0 |
| | y0 |
| | L0 |
| | Nconnect |
| | L1 |
| | $\delta_{11}$ |
| | $\delta_{12}$ |
| | L2 |
| | $\delta_{21}$ |
| | $\delta_{22}$ |
| | ⋮ |
| | Ln |
| | $\delta_{n1}$ |
| | $\delta_{n2}$ |

FIG. 27B

| PH | Code |
| --- | --- |
| | flag |
| | N |
| PHd | Code \| flag \| N |
| | $AI_1$ |
| | $AI_2$ |
| | ⋮ |
| | $AI_n$ |
| | Padding |
| EP1 | x0 |
| | y0 |
| | L0 |
| | Nconnect |
| | L1 |
| | $\delta_{11}$ |
| | $\delta_{12}$ |
| | L2 |
| | $\delta_{21}$ |
| | $\delta_{22}$ |
| | ⋮ |
| | Ln |
| | $\delta_{n1}$ |
| | $\delta_{n2}$ |
| PHd | ⋮ |
| EP2 | x1 |
| | y1 |
| PHd | |
| EPN | ⋮ |

DRAWING DATA GENERATING METHOD

CROSS REFERENCE TO RELATED APPLICATION

This application is based upon and claims benefit of priority from the Japanese Patent Application No. 2016-000563, filed on Jan. 5, 2016, the entire contents of which are incorporated herein by reference.

FIELD

The present invention relates to a drawing data generating method.

BACKGROUND

As the integration density of LSIs increases, the circuit line widths of semiconductor devices become narrower year by year. Forming a desired circuit pattern on a semiconductor device involves using a technique in which a high-precision original pattern (also referred to as a mask, or particularly referred to as a reticule if it is used in a stepper or scanner) formed on a quartz member is transferred in a reduced form onto a wafer using a step-and-repeat exposure system. The high-precision original pattern is drawn by an electron beam drawing apparatus using a so-called electron beam lithography technique.

In electron beam drawing, the layout of a semiconductor integrated circuit is designed, and then layout data (design data) is generated. The layout data is converted to drawing data, which is input to an electron beam drawing apparatus. The electron beam drawing apparatus performs drawing on the basis of the drawing data. For efficient data transfer, the drawing data is defined in a data-compressed format.

For example, Patent Literature 1 (Japanese Unexamined Patent Application Publication No. 2015-95538) proposes a data format of drawing data in which after a plurality of pieces of figure information are defined, dose information of each figure is sequentially defined. Patent Literature 1 also proposes a data format of drawing data whose amount is compressed by using, as dose information of each of the second and succeeding figures, a difference value between the dose of the figure and the dose of the preceding figure.

BRIEF DESCRIPTION OF THE DRAWINGS

FIG. 7A and FIG. 7B each illustrate an example of order of defining dose information in array representation.

FIG. 8 illustrates an example of data compression according to the first embodiment.

FIG. 14 illustrates an example of data compression according to the second embodiment.

FIG. 15 illustrates an example of data compression according to a third embodiment.

FIG. 20A illustrates an example of data compression where no sorting is done, and FIG. 20B illustrates an example of data compression where sorting is done.

FIG. 21 illustrates an example of data compression where sorting is done.

FIG. 22 illustrates an example of dividing a polygon figure.

FIG. 23A and FIG. 23B each illustrate an example of dividing a polygon figure, and FIG. 23C illustrates a data structure of drawing data.

FIG. 24A to FIG. 24D each illustrate an example of dividing a polygon figure, and FIG. 24E illustrates a data structure of drawing data.

FIG. 25A and FIG. 25B each illustrate an example of dividing a polygon figure, and FIG. 25C illustrates a data structure of drawing data.

FIG. 26A and FIG. 26B each illustrate an example of dividing a polygon figure.

FIG. 27A and FIG. 27B each illustrate a data structure of drawing data.

DETAILED DESCRIPTION

Figure 1:
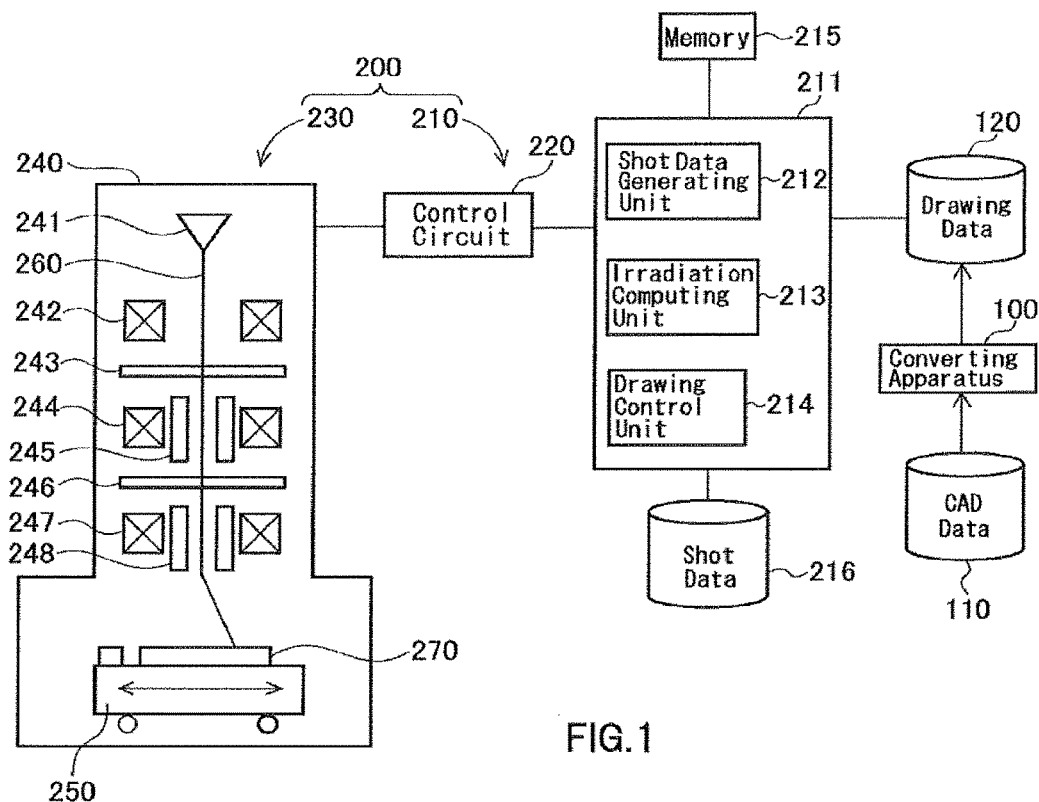
FIG. 1 illustrates a configuration of a drawing system according to a first embodiment.

In one embodiment, a drawing data generating method is for generating drawing data input to a drawing apparatus that draws a plurality of figure patterns on an object using a charged particle beam. The method includes generating the drawing data in accordance with a data format that defines a plurality of pieces of figure information, and sequentially defines dose information of each figure before or after the plurality of pieces of figure information. The dose information of each of second and succeeding figures is converted to a representation based on the dose information of any preceding figure, and a data length of the dose information is made variable for each figure.

An embodiment of the present invention will be described below with reference to the drawings.

First Embodiment

FIG. 1 is a conceptual diagram illustrating a configuration of a drawing system according to a first embodiment. The drawing system includes a converting apparatus 100 and a drawing apparatus 200.

The drawing apparatus 200 includes a controller 210 and a drawing unit 230. The drawing apparatus 200 is a charged particle beam drawing apparatus, and is in particular, a variable shaping type drawing apparatus. The drawing unit 230 includes an electron lens barrel 240, an XY stage 250, an electron gun 241, an illumination lens 242, a first aperture 243, a projection lens 244, a deflector 245, a second aperture 246, an objective lens 247, and a deflector 248. A mask substrate 270 subjected to drawing is on the XY stage 250 during drawing.

The controller 210 includes a control calculator 211, a memory 215, a storage device 216, such as a magnetic disk device, and a control circuit 220. The control calculator 211 includes a shot data generating unit 212, an irradiation computing unit 213, and a drawing control unit 214. Functions, such as the shot data generating unit 212, the irradiation computing unit 213, and the drawing control unit 214, may either be configured as hardware (e.g., an electric circuit) or as software (e.g., a program) that executes these functions. Data input to and output from the shot data generating unit 212, the irradiation computing unit 213, and the drawing control unit 214, and data during computation, are stored in the memory 215 on an as-needed basis.

The converting apparatus 100 converts layout data (CAD data) stored in the storage device 110 to generate drawing data that can be input to the drawing apparatus 200. The generated drawing data is stored in the storage device 120.

While not shown, the drawing apparatus 200 typically internally performs a dose correction calculation for proximity effect correction or the like. However, a correction residual may remain even when a dose internally calculated by the drawing apparatus 200 is used. Accordingly, a user performs a proximity effect correction calculation before drawing data is input to the drawing apparatus 200, and sets the amount of dose modulation (or a dose) for each figure pattern. The calculation and setting of the amount of dose modulation are performed before data conversion from layout data to drawing data. The amount of dose modulation is set by the user or a correction tool (not shown). The present embodiment describes the subsequent data conversion on the assumption that the amount of dose modulation is calculated and set for each figure pattern.

Figure 2:
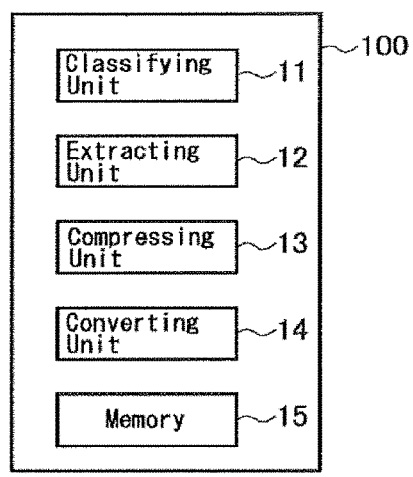
FIG. 2 is a block diagram of a converting apparatus according to the first embodiment.

FIG. 2 is a conceptual diagram illustrating a configuration of the converting apparatus 100. The converting apparatus 100 includes a classifying unit 11, an extracting unit 12, a compressing unit 13, a converting unit 14, and a memory 15. Data input to and output from each unit of the converting apparatus 100, and data during computation, are stored in the memory 15 on an as-needed basis. At least part of the converting apparatus 100 may be formed by either hardware or software. If at least part of the converting apparatus 100 is formed by software, a program that implements at least some of the functions of the converting apparatus 100 may be stored in a recording medium, and read and executed by a computer. The recording medium is not limited to a removable recording medium, such as a magnetic disk or an optical disk, and may be a fixed recording medium, such as a hard disk drive or a memory.

Figure 3:
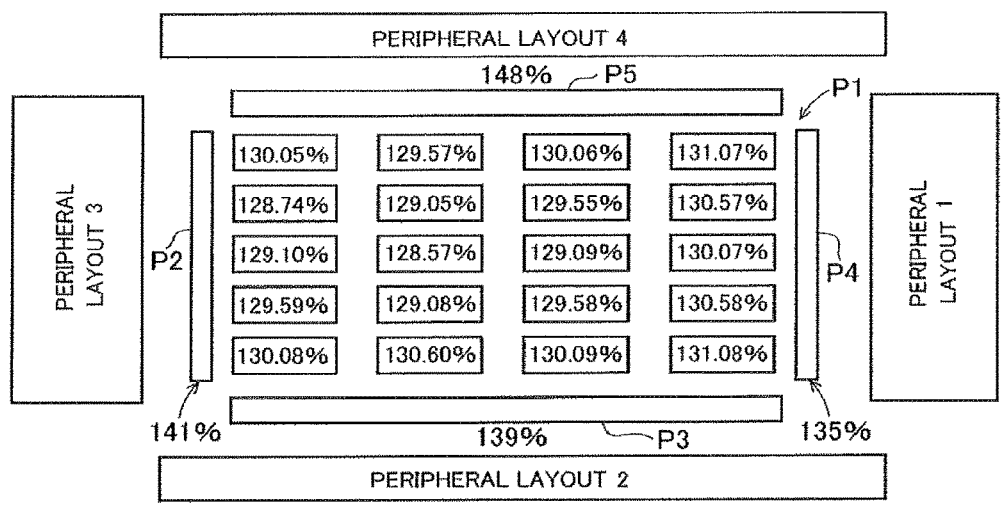
FIG. 3 illustrates a pattern layout in which the amount of dose modulation is defined for each figure.

FIG. 3 illustrates a pattern layout in which the amount of dose modulation is defined for each figure. In the example of FIG. 3, an array pattern P1 is positioned in the center of a region surrounded by peripheral layouts. A vertically long rectangular pattern P2 with an amount of dose modulation of 141% is positioned to the left of the figures of the array pattern P1. A horizontally long rectangular pattern P3 with an amount of dose modulation of 139% is positioned below the figures of the array pattern P1. A vertically long rectangular pattern P4 with an amount of dose modulation of 135% is positioned to the right of the figures of the array pattern P1. A horizontally long rectangular pattern P5 with an amount of dose modulation of 148% is positioned above the figures of the array pattern P1.

When a proximity effect correction and/or a correction to a phenomenon having a smaller range of impact than a proximity effect are/is performed before data conversion, the amount of dose modulation varies from one to another of the figure patterns arranged in an array to form the array pattern P1, as illustrated in FIG. 3. The present embodiment reduces the amount of data when the layout data is converted to drawing data.

Figure 4:
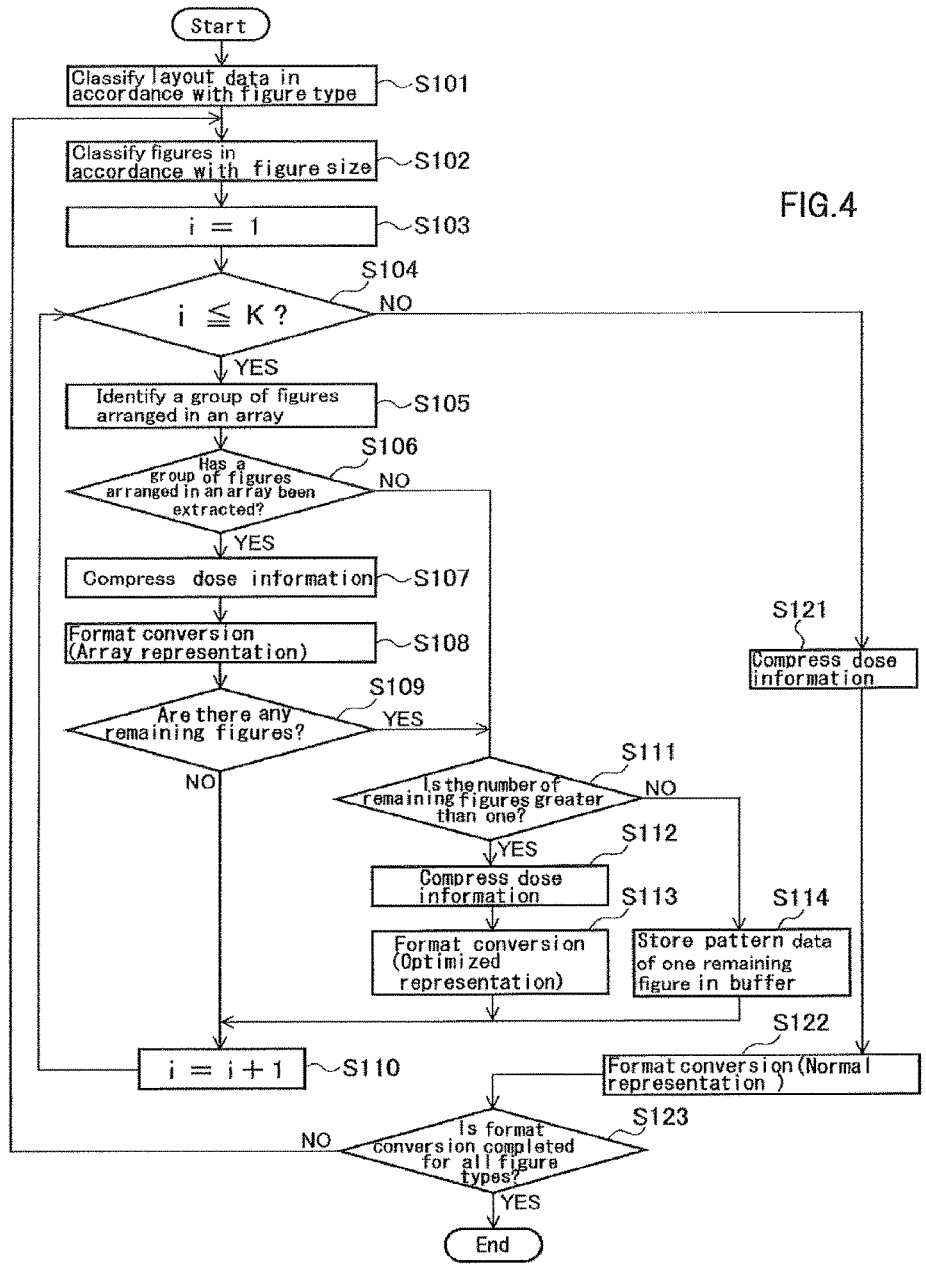
FIG. 4 is a flowchart illustrating a drawing data generating method according to the first embodiment.

FIG. 4 is a flowchart illustrating a drawing data generating method according to the present embodiment. When layout data is converted to drawing data, for example, a drawing region may be virtually divided in a hierarchical manner into a plurality of regions, such as a frame region, a block region in a layer below the frame region, and figures in a layer below the block region, for the purpose of data compression. The figures may be rotated, mirrored, enlarged, or reduced. In the present embodiment, such processing is performed in the same manner as in the related art, and will not be described here. After the processing ends, each figure pattern data is defined as drawing data. Data conversion performed at this stage will now be described.

First, the classifying unit 11 reads layout data from the storage device 110 and classifies the layout data in accordance with the figure type (step S101). The classifying unit 11 classifies a group of figures classified as one figure type, in accordance with the figure size (step S102). For each figure type, figure sizes are classified into K types (figure size numbers 1 to K) for both the x and y directions.

The figure size number i is set to 1 (the first figure size classified) (step S103).

If the figure size number i is less than or equal to K (Yes in step S104), the process proceeds to step S105. If the figure size number i is greater than K (No in step S104), the process proceeds to step S121.

From groups of figures with the figure size number i, the extracting unit 12 identifies and extracts a group of figures arranged in an array (step S105). If the group of figures arranged in an array has been extracted (Yes in step S106), the process proceeds to step S107. Otherwise (No in step S106), the process proceeds to step S111.

The extracting unit 12 extracts dose information (e.g., information about the amount of dose modulation) of each figure in the group of figures arranged in an array. Then, the compressing unit 13 compresses the dose information of each figure (step S107). Next, the converting unit 14 performs format conversion (data conversion) of pattern data of the group of figures arranged in an array, using a data format in array representation (step S108).

Figure 5:
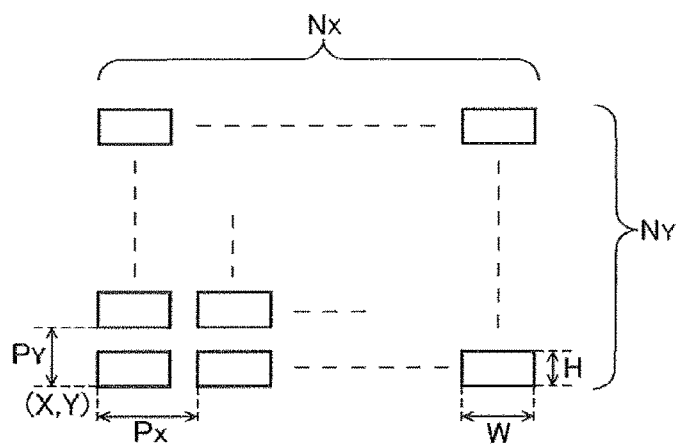
FIG. 5 illustrates a group of figures arranged in an array.
Figure 6:
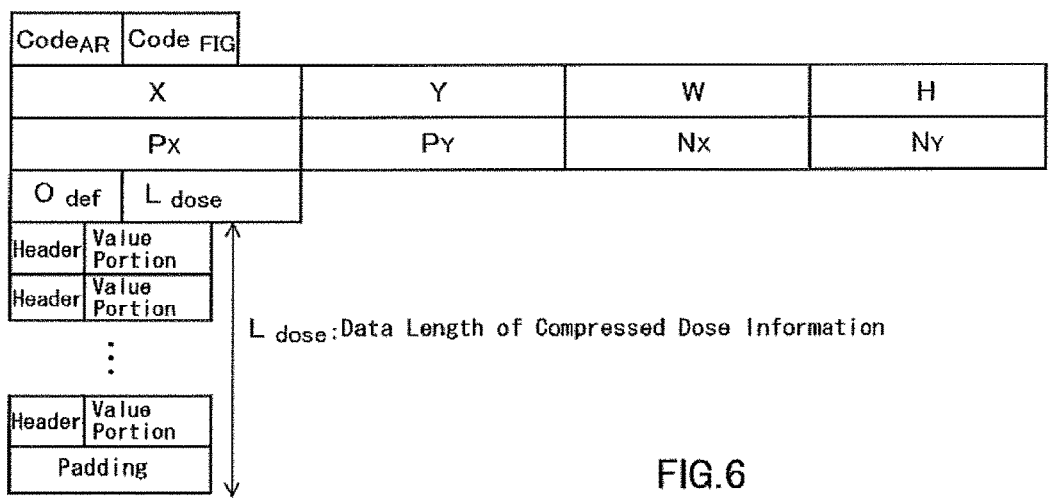
FIG. 6 illustrates a data format with the amount of dose modulation in array representation.

FIG. 5 illustrates a group of figures arranged in an array. In the example of FIG. 5, $N_X \times N_Y$ figure patterns of the same figure type and size are arranged in an array. FIG. 6 illustrates a data format with the amount of dose modulation in array representation, for pattern data of the group of figures illustrated in FIG. 5.

In the data format illustrated in FIG. 6, 1-byte representation code ($Code_{AR}$) indicating that the data format is in array representation that defines a plurality of figure patters of the same figure type and size arranged in an array, 1-byte figure type code ($Code_{FIG}$) indicating a figure type, 3-byte figure pattern coordinates (X, Y) of the first figure pattern serving as a reference, and 2-byte sizes (W, H) in the x and y directions are defined. Then, 3-byte arrangement pitches ($P_X$, $P_Y$) and 2-byte figure pattern counts ($N_X$, $N_Y$) (each indicating the number of figure patterns arranged) are defined.

The representation code ($Code_{AR}$) is an identifier indicating that the same figures are arranged in an array. The figure type code (Code$_{FIG}$) is an identifier indicating a figure type. The coordinates (X, Y) of the first figure pattern are reference coordinates for figures arranged in an array. Thus, a plurality of pieces of figure information, such as the representation code (Code$_{AR}$), figure type code (Code$_{FIG}$), coordinates (X, Y) of the first figure pattern, sizes (W, H), arrangement pitches (P$_X$, P$_Y$), and figure pattern counts (N$_X$, N$_Y$) are defined.

In the data format in array representation according to the present embodiment, dose information of each figure is sequentially defined before or after the plurality of pieces of figure information are defined. In the example of FIG. 6, dose information of each figure is sequentially defined after figure information is defined. The dose information is compressed information. The compression processing will be described later on.

Between the figure information and the dose information of each figure, 1-byte definition order code (O$_{def}$) indicating the order of defining dose information and a 2-byte data length (L$_{dose}$) of the entire dose information are defined. The dose information has a bitwise data length. Since it is preferable that data processed on computers be an integral multiple of a byte (8 bits), padding data is added to the end of dose information. For example, if the total amount of data of N$_X$×N$_Y$ pieces of dose information is 8005 bits, 3-bit padding data is added.

FIG. 7A and FIG. 7B each illustrate an example of order of defining dose information in array representation. As an example, FIG. 7A and FIG. 7B each illustrate rectangular patterns arranged in a 3-by-3 array in the x and y directions.

In FIG. 7A, the dose information is first defined in the first column in the x direction, in order from the figure at the lower end of the first column in the x direction (i.e., from the end in the −y direction) toward the y direction, until the figure in the uppermost row in the y direction is reached. After the dose information is defined for the figure in the uppermost row in the y direction, the defining process proceeds from the first column to the second column in the x direction, and further proceeds in order from the figure in the uppermost row in the y direction toward the −y direction until the figure in the lowermost row in the y direction is reached. After the dose information is defined for the figure in the lowermost row in the y direction, the defining process proceeds from the second column to the third column in the x direction, and further proceeds in order from the figure in the lowermost row in the y direction toward the y direction until the figure in the uppermost row in the y direction is reached. Thus, the dose information of each figure is defined in order toward the x direction in a zigzag manner with respect to the y direction.

In FIG. 7B, the dose information is first defined in the first column in the x direction, in order from the figure at the lower end of the first column in the x direction (i.e., from the end in the −y direction) toward the y direction, until the figure in the uppermost row in the y direction is reached. After the dose information is defined for the figure in the uppermost row in the y direction, the defining process proceeds in order toward the x direction while staying at the position of the uppermost row in the y direction, until the figure in the last column in the x direction is reached. After the dose information is defined for the figure in the last column in the x direction, the defining process proceeds in order toward the −y direction until the figure in the lowermost row in the y direction is reached. After the dose information is defined for the figure in the lowermost row in the y direction, the defining process proceeds in order toward the −x direction to reach the undefined figure in the forward column (which is one column to the right of the foremost column) in the x direction. Then, the defining process further proceeds in order toward the y direction to reach the undefined figure in the upper row (which is one row below the uppermost row) in the y direction. Thus, the dose information of each figure is defined in order from the outside toward the inside in a spiral manner.

An identifier corresponding to the type of definition order illustrated in FIG. 7A or FIG. 7B is set as the definition order code (O$_{def}$).

The compressing unit 13 compresses the dose information of the extracted group of figures arranged in an array. Specifically, for N$_X$×N$_Y$ figure patterns arranged in an array, the compressing unit 13 expresses the dose information of every figure pattern, except the first one serving as a reference (i.e., the dose information of each of the second and succeeding figure patterns), by a difference from the preceding dose information (dose or the amount of dose modulation).

The compressing unit 13 converts the dose information to a data structure composed of a header portion and a value portion. An example of the header portion and the value portion is shown in Table 1 below. The example of Table 1 shows that the dose before compression is 10 bits.

TABLE 1

| Value | Header (2 Bits) Meaning | Value Portion |
|---|---|---|
| 00 | Full Bit | Unsigned 10 Bits |
| 01 | Difference Representation 1 | Sign 8 Bits (1-Bit Sign + 7 Bits) |
| 10 | Difference Representation 2 | Sign 6 Bits (1-Bit Sign + 5 Bits) |
| 11 | Same as dose of preceding figure pattern | None (0 Bit) |

If a difference between the dose of a given figure pattern and the dose of the preceding figure pattern is greater than 32 shades of gray and less than or equal to 128 shades of gray, the compressing unit 13 expresses the dose of the given figure pattern by a 2-bit header "01" indicating that the corresponding value portion is in difference representation 1, and by a signed 8-bit value portion indicating the difference from the dose of the preceding figure pattern.

If a difference between the dose of a given figure pattern and the dose of the preceding figure pattern is less than or equal to 32 shades of gray, the compressing unit 13 expresses the dose of the given figure pattern by a 2-bit header "10" indicating that the corresponding value portion is in difference representation 2, and by a signed 6-bit value portion indicating the difference from the dose of the preceding figure pattern. This reduces the data size of the dose information from 10 bits to 8 bits(=2 bits+6 bits).

If the dose of a given figure pattern is the same as the dose of the preceding figure pattern, the compressing unit 13 expresses the dose information only by a 2-bit header "11" indicating that the dose is the same as the preceding one. This reduces the data size of the dose information from 10 bits to 2 bits.

If a difference between the dose of a given figure pattern and the dose of the preceding figure pattern is greater than 128 shades of gray, the compressing unit 13 sets the dose of the given figure pattern as a value portion, and adds a 2-bit header "00" indicating that the value portion is in full bit representation (unsigned 10 bits) to the value portion.

FIG. 8 illustrates an example of conversion of representation (data compression) of dose information performed by the compressing unit 13. In FIG. 8, doses before compression and value portions after compression are in decimal representation for convenience of description, but they are actually in binary representation.

The j-th figure pattern has a dose before compression as a value portion, to which a 2-bit header "00" indicating that the value portion is in full bit representation (unsigned 10 bits) is added.

The difference between the dose of the (j+1)-th figure pattern and the dose of the j-th figure pattern is greater than 32 shades of gray and less than or equal to 128 shades of gray. Therefore, the (j+1)-th figure pattern has a header "01" indicating that the corresponding value portion is in difference representation 1, and has a difference −33 from the dose of the j-th figure pattern (signed 8 bits) as the value portion.

The difference between the dose of the (j+2)-th figure pattern and the dose of the (j+1)-th figure pattern is less than or equal to 32 shades of gray. Therefore, the (j+2)-th figure pattern has a header "10" indicating that the corresponding value portion is in difference representation 2, and has a difference −10 from the dose of the (j+1)-th figure pattern (signed 6 bits) as the value portion.

The difference between the dose of the (j+3)-th figure pattern and the dose of the (j+2)-th figure pattern is less than or equal to 32 shades of gray. Therefore, the (j+3)-th figure pattern has a header "10" indicating that the corresponding value portion is in difference representation 2, and has a difference −5 from the dose of the (j+2)-th figure pattern (signed 6 bits) as the value portion.

Since the dose of the (j+4)-th figure pattern is the same as the dose of the (j+3)-th figure pattern, the representation is converted only to a 2-bit header "11".

In the example shown in FIG. 8, the data size of the dose information of the five figure patterns before compression is 10 bits×5=50 bits. After the compression, the data size is 12 bits+10 bits+8 bits+8 bits+2 bits=40 bits, and this shows that the data size can be reduced. Thus, by varying the data length of the difference representation (signed 8 bits, signed 6 bits, or 0 bits in this example) in accordance with the magnitude of difference from the dose of the preceding figure, the dose information can be represented by compressed data.

After the compression of dose information and the format conversion are performed as described above, a determination is made as to whether there are any remaining figures not extracted as an array. If there are no remaining figures (No in step S109), 1 is added to the figure size number i (step S110) and the process returns to step S104.

If there are any remaining figures (Yes in step S109), a determination is made as to whether the number of remaining figures is greater than one (i.e., greater than or equal to two). If there is one remaining figure (No in step S111), the pattern data of the one remaining figure is stored in the memory 15 for a data format in normal representation described below (step S114).

If the number of remaining figures is greater than or equal to two (Yes in step S111), the extracting unit 12 extracts the dose information of each of the remaining figures. Then, the compressing unit 13 compresses the dose information of each figure (step S112). Next, the converting unit 14 performs format conversion (data conversion) of the pattern data of the group of remaining figures using a data format in optimized representation (step S113).

Figure 9:
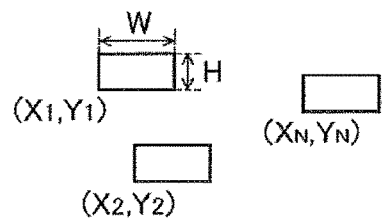
FIG. 9 illustrates figures of the same figure type and size which are not arranged in an array.
Figure 10:
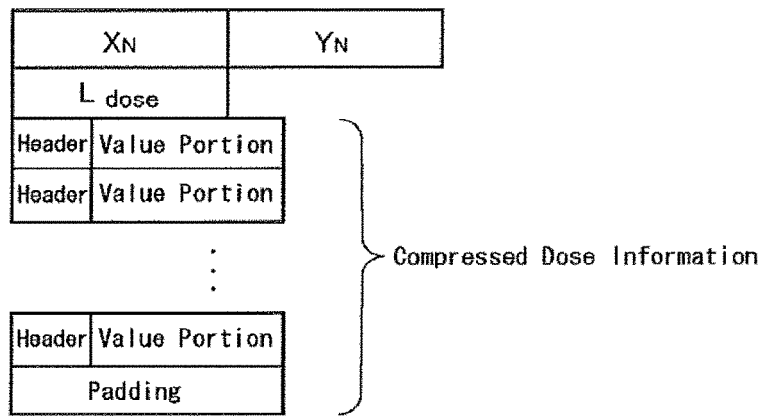
FIG. 10 illustrates a data format with the amount of dose modulation in optimized representation.

FIG. 9 illustrates remaining figures not extracted as an array. As illustrated, a plurality of (N) figure patterns of the same figure type and size and different coordinates are arranged. FIG. 10 illustrates a data format with doses in optimized representation, for the pattern data of the figures illustrated in FIG. 9.

In the data format illustrated in FIG. 10, after the position and size of the first figure pattern are defined, 1-byte representation code ($Code_{OR}$) indicating that the data format is in optimized representation that lists the positions of the second and succeeding figure patterns in order, 1-byte figure type code ($Code_{FIG}$) indicating a figure type, and a 2-byte figure count (N) are defined. Next, 3-byte coordinates ($X_i$, $Y_i$) of the first figure pattern and 2-byte figure sizes (W, H) of the first figure pattern in the x and y directions are defined. Then, coordinates ($X_i$, $Y_i$) of the second and succeeding figure patterns are defined in order.

An identifier indicating that the same figures are repeatedly arranged is set as the representation code ($Code_{OR}$). An identifier indicating a figure type is set as the figure type code ($Code_{FIG}$). Thus, a plurality of pieces of figure information, such as the representation code ($Code_{OR}$), figure type code ($Code_{FIG}$), figure count (N), coordinates ($X_i$, $Y_i$), figure sizes (W, H), and coordinates ($X_i$, $Y_i$), are defined.

In the data format in optimized representation, before or after the plurality of pieces of figure information are defined, the dose information of each figure is sequentially defined in order from the first figure pattern. In the example of FIG. 10, the dose information of each figure is sequentially defined after the plurality of pieces of figure information are defined. The dose information is compressed by the compressing unit 13. The dose information of each of the second and succeeding figure patterns is represented by a difference from the preceding dose information, and converted to a data structure composed of a header portion and a value portion as in Table 1. The compression reduces the data size of the dose information.

Between the figure information and the dose information, a 2-byte data length ($L_{dose}$) of the entire dose information is defined.

Steps S105 to S114 are repeated for all figure sizes. Thus, for groups of figures of the same figure type and figure sizes, drawing data can be generated using a data format in array representation and/or a data format in optimized representation that can reduce the amount of data even when the dose varies from one figure to another.

After steps S105 to S114 are repeated for all figure sizes, if the figure size number i exceeds K (No in step S104), for the group of figures of the same figure type and different sizes stored in the memory 15 because of not corresponding to either of the array representation and the optimized representation in the figure size numbers 1 to K, the dose information (e.g., the amount of dose modulation) of each figure is extracted. Then, the compressing unit 13 compresses the dose information of each figure (step S121). Next, the converting unit 14 performs format conversion (data conversion) of the pattern data of the group of figures of the same figure type and different figure sizes using a data format in normal representation (step S122).

Figure 11:
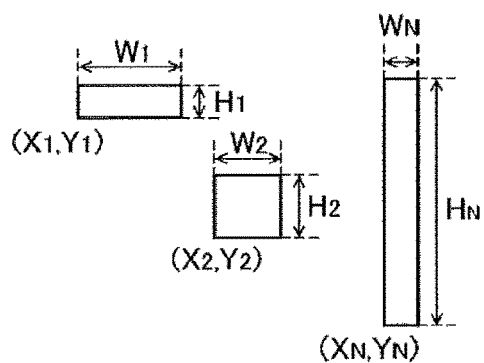
FIG. 11 illustrates figures of the same figure type and different figure sizes.
Figure 12:
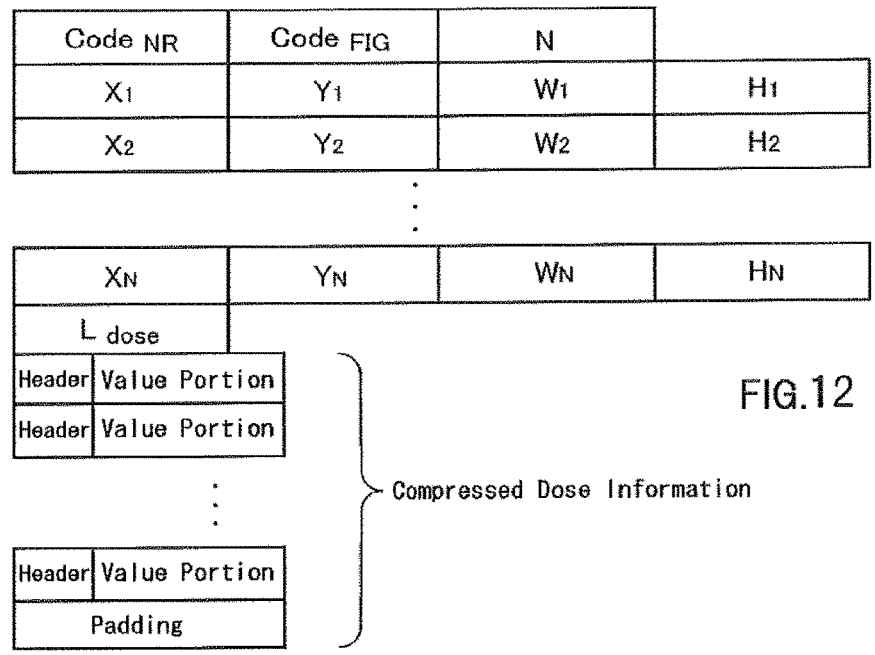
FIG. 12 illustrates a data format with the amount of dose modulation in normal representation.

FIG. 11 illustrates a plurality of (N) figure patterns of the same figure type and different figure sizes and coordinates. The figure type is rectangular in FIG. 11. FIG. 12 illustrates a data format with doses in normal representation, for the pattern data of the figures illustrated in FIG. 11.

In the data format illustrated in FIG. 12, 1-byte representation code ($Code_{NR}$) indicating that the data format is in normal representation that lists the positions and sizes of the figure patterns in order, 1-byte figure type code ($Code_{FIG}$) indicating a figure type, and a 2-byte figure count (N) are defined. Next, for each figure pattern, 3-byte coordinates $(X_i, Y_i)$ and 2-byte figure sizes $(W_i, H_i)$ in the x and y directions are defined in order from the first figure pattern.

An identifier indicating that figures of the same figure type are repeatedly arranged is set as the representation code ($Code_{NR}$). An identifier indicating the figure type is set as the figure type code ($Code_{FIG}$). Thus, a plurality of pieces of figure information, such as the representation code ($Code_{NR}$), figure type code ($Code_{FIG}$), figure count (N), coordinates $(X_i, Y_i)$ repeated in order from the first figure, and figure sizes $(W_i, H_i)$, are defined.

In the data format in normal representation, before or after the plurality of pieces of figure information are defined, the dose information of each figure is sequentially defined in order from the first figure pattern. In the example of FIG. 12, the dose information of each figure is sequentially defined after the plurality of pieces of figure information are defined. The dose information is compressed by the compressing unit 13. The dose information of each of the second and succeeding figure patterns is represented by a difference from the preceding dose information, and converted to a data structure composed of a header portion and a value portion as in Table 1. The compression reduces the data size of the dose information.

Between the figure information and the dose information, a 2-byte data length ($L_{dose}$) of the entire dose information is defined.

Steps S102 to S122 are repeated until format conversion (data conversion) is completed for all figure types. If the format conversion (data conversion) is completed for all figure types (Yes in step S123), the drawing data generating process ends.

The generated drawing data is stored in the storage device 120. The drawing apparatus 200 performs drawing using the drawing data.

In a shot data generating step, the shot data generating unit 212 reads the drawing data from the storage device 120, and performs multiple steps of data conversion to generate shot data specific to the apparatus. For the drawing apparatus 200 to draw figure patterns, each figure pattern defined in the drawing data needs to be divided into pieces of a size that can be irradiated by one beam shot. For actual drawing, the shot data generating unit 212 divides each figure pattern into shot figures of a size that can be irradiated by one beam shot. Then, the shot data generating unit 212 generates shot data for each of the shot figures. Pattern data, such as a figure type, a figure size, an irradiation position, and a dose (or the amount of dose modulation), is defined in the shot data.

In an irradiation computing step, the irradiation computing unit 213 expands the compressed dose information and computes an irradiation d for each mesh region of a predetermined size. The irradiation d can be computed by multiplying a reference irradiation by a dose (the amount of dose modulation). The irradiation d may be determined by multiplying a dose (the amount of dose modulation) defined in the drawing data by a correction coefficient, such as a fogging-effect correction irradiation coefficient for correcting a fogging effect or a loading-effect correction irradiation coefficient for correcting a loading effect, A correction calculation for each phenomenon, such as proximity effect correction, may be performed with the same technique as that in the related art.

In a drawing step, the drawing control unit 214 outputs a control signal to the control circuit 220 to perform drawing. The control circuit 220 receives shot data and data of each correction irradiation, and controls the drawing unit 230 in accordance with the control signal from the drawing control unit 214. The drawing unit 230 draws the figure pattern on the mask substrate 270 using an electron beam 260. Specifically, the drawing unit 230 operates in the following manner.

The electron beam 260 from the electron gun 241 illuminates the entire first aperture 243 having a rectangular hole through the illumination lens 242. The electron beam 260 is thus shaped into a rectangle here. After passing through the first aperture 243, the electron beam 260 forming a first aperture image is projected through the projection lens 244 onto the second aperture 246. The position of the first aperture image on the second aperture 246 is controlled by the deflector 245, and this can change the beam shape and dimensions. After passing through the second aperture 246, the electron beam 260 forming a second aperture image is brought into focus by the objective lens 247, deflected by the deflector 248, and applied to a desired point of the mask substrate 270 on the XY stage 250 which is movably disposed.

Since the amount of drawing data can be reduced in the present embodiment, the efficiency of data transfer to the drawing apparatus 200 can be improved.

Note that the number of bits in each of the full bit representation and the difference representation of the dose information is not limited to the example described above.

Second Embodiment

An increase/decrease template for the number of bits in the difference representation of dose information may be determined in advance, so that the compressing unit 13 can convert the dose information of each figure pattern to a data structure composed of a header portion and a value portion by changing the number of bits in the difference representation while referring to the template.

Figure 13:
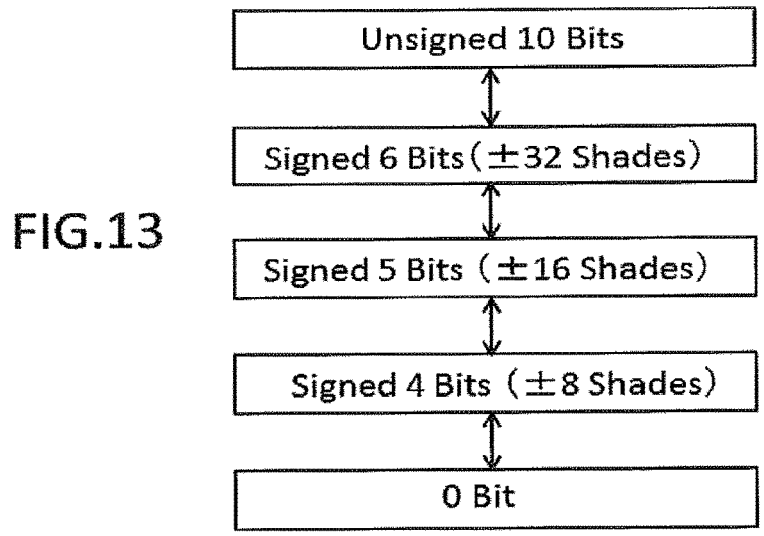
FIG. 13 illustrates a bit increase/decrease template according to a second embodiment.

An example of the header portion and the value portion is shown in Table 2 below. This example shows that the dose before compression is 10 bits. FIG. 13 illustrates a bit increase/decrease template.

TABLE 2

| Header (2 Bits) | | |
|---|---|---|
| Value | Meaning | Value Portion |
| 00 | Full Bit | Unsigned 10 Bits |
| 01 | The number of bits is the same as that in the preceding dose | Difference Representation where the number of bits ss the same as that of dose information of preceding figure (One bit is a sign bit) |
| 10 | Decreaseb Bit length by one scale | Difference Representation where the bit length is decreased by one scale |
| 11 | Increase bit length by one scale | Difference Representation where the bit length is increased by one scale |

FIG. 14 illustrates an example of conversion of representation (data compression) of dose information performed by the compressing unit 13. In FIG. 14, doses before compression and value portions after compression are in decimal representation for convenience of description, but they are actually in binary representation.

The j-th figure pattern has a dose as a value portion, to which a 2-bit header "00" indicating that the value portion is in full bit representation (unsigned 10 bits) is added.

The difference between the (j+1)-th figure pattern and the j-th figure pattern is less than or equal to 32 shades of gray.

Therefore, the header portion of the (j+1)-th figure pattern has 2-bit "10" indicating that the corresponding value portion is in difference representation where the bit length is decreased by one scale, and the value portion has a difference −20 from the dose of the j-th figure pattern (signed 6 bits).

The difference between the dose of the (j+2)-th figure pattern and the dose of the (j+1)-th figure pattern is less than or equal to 16 shades of gray. Accordingly, the number of bits in the difference representation of the (j+2)-th dose can be made less than that in the difference representation of the (j+1)-th dose. Therefore, the header portion of the (j+2)-th dose information has 2-bit "10" indicating that the corresponding value portion is in difference representation where the bit length is decreased by one scale, and the value portion has a difference −13 (signed 5 bits) from the dose of the (j+1)-th figure pattern.

The difference between the dose of the (j+3)-th figure pattern and the dose of the (j+2)-th figure pattern is greater than 8 shades of gray and less than or equal to 16 shades of gray. Accordingly, the number of bits in the difference representation of the dose information of the (j+3)-th figure pattern is the same as the number of bits in the difference representation of the dose information of the (j+2)-th figure pattern. Therefore, the header portion of the dose of the (j+3)-th figure pattern has "01" indicating that the corresponding value portion is in difference representation where the number of bits is the same as that in the preceding dose, and the value portion has a difference −9 (signed 5 bits) from the dose of the (j+2)-th figure pattern.

The difference between the dose of the (j+4)-th figure pattern and the dose of the (j+3)-th figure pattern is less than or equal to 8 shades of gray. Accordingly, the number of bits in the difference representation of the dose of the (j+4)-th figure pattern can be made less than that in the difference representation of the dose of the (j+3)-th figure pattern. Therefore, the header portion of the dose of the (j+4)-th figure pattern has "10" indicating that the corresponding value portion is in difference representation where the bit length is decreased by one scale, and the value portion has a difference −6 (signed 4 bits) from the mesh value of the (j+3)-th figure pattern.

The difference between the dose of the (j+5)-th figure pattern and the dose of the (j+4)-th figure pattern is greater than 8 shades of gray and less than or equal to 16 shades of gray. Accordingly, the number of bits in the difference representation of the dose of the (j+5)-th figure pattern needs to be made greater than that in the difference representation of the dose of the (j+4)-th figure pattern. Therefore, the header portion of the dose of the (j+5)-th figure pattern has "11" indicating that the corresponding value portion is in difference representation where the bit length is increased by one scale, and the value portion has a difference −10 (signed 5 bits) from the dose of the (j+4)-th figure pattern.

The difference between the dose of the (j+6)-th figure pattern and the dose of the (j+5)-th figure pattern is less than or equal to 8 shades of gray. Accordingly, the number of bits in the difference representation of the dose of the (j+6)-th figure pattern can be made less than that in the difference representation of the dose of the (j+5)-th figure pattern. Therefore, the header portion of the dose of the (j+6)-th figure pattern has "10" indicating that the corresponding value portion is in difference representation where the bit length is decreased by one scale, and the value portion has a difference −4 (signed 4 bits) from the dose of the (j+5)-th figure pattern.

The dose of the (j+7)-th figure pattern is the same as the dose of the (j+6)-th figure pattern, and the difference therebetween is 0. Accordingly, the bit length can be further decreased by one scale from signed 4 bits, which is the difference representation of the dose of the (j+6)-th figure pattern. Therefore, the representation of the dose of the (j+7)-th figure pattern is converted only to a 2-bit header "10" indicating that the corresponding value portion is in difference representation where the bit length is decreased by one scale.

In the example shown in FIG. 14, the data size of the doses of the eight figure patterns before compression is 10 bits×8=80 bits. After the compression, the data size is 12 bits+8 bits+7 bits++7 bits+6 bits+7 bits+6 bits+2 bits=55 bits, and this shows that the data size can be reduced.

Third Embodiment

In the first embodiment described above, dose information is represented by a difference from the dose of the preceding figure pattern. Alternatively, dose information may be determined by linear interpolation between the dose of any of preceding figure patterns and the dose of any of succeeding figure patterns.

The compressing unit 13 converts dose information to a data structure composed of a header portion and a value portion, such as that shown in Table 3 below. The example of Table 3 shows that the dose before compression is 10 bits.

TABLE 3

| Header (1 Bit) | | |
| --- | --- | --- |
| Value | Meaning | Value Portion |
| 0 | Interpolation End Point (Full Bit) | Unsigned 10 Bits |
| 1 | Within Interpolation Section | None (0 Bit) |

Figures 16, 17:
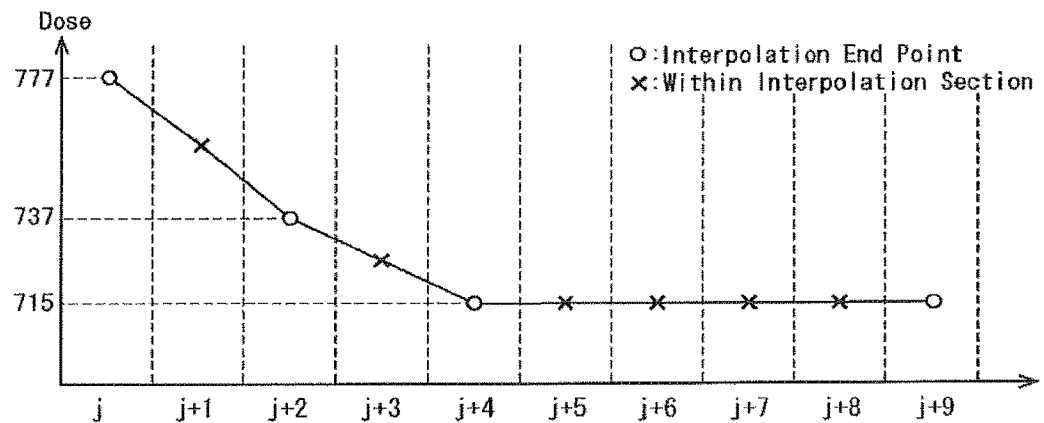
FIG. 16 is a graph showing an example of data interpolation according to the third embodiment.
FIG. 17 illustrates an example of data compression according to a fourth embodiment.

FIG. 15 illustrates an example of conversion of representation (data compression) of dose information performed by the compressing unit 13. FIG. 16 is a graph obtained by plotting doses. In FIG. 15 and FIG. 16, doses are in decimal representation for convenience of description, but they are actually in binary representation.

Referring to the doses of the j-th to (j+9)-th figure patterns, the dose of the (j+1)-th figure pattern is an intermediate value between the dose of the j-th figure pattern and the dose of the (j+2)-th figure pattern. The dose of the (j+3)-th figure pattern is an intermediate value between the dose of the (j+2)-th figure pattern and the dose of the (j+4)-th figure pattern. The (j+4)-th to (j+9)-th figure patterns have the same mesh value.

Therefore, the dose information of each of the j-th, (j+2)-th, (j+4)-th, and (j+9)-th figure patterns is 11-bit data obtained by adding, to the corresponding dose, a 1-bit header "0" indicating that the dose is an interpolation end point in full bit representation (unsigned 10 bits).

Since the dose information of each of the other figure patterns (i.e., the (j+1)-th, (j+3)-th, and (j+5)-th to (j+8)-th figure patterns) is within an interpolation section, the representation is converted only to a 1-bit header "1".

In the example shown in FIG. 15 and FIG. 16, the data size of the dose information of the ten figure patterns before compression is 10 bits×10=100 bits. After the compression, the data size is 11 bits×4+1 bit×6=50 bits, and this shows that the data size can be reduced.

Fourth Embodiment

In the linear interpolation of the third embodiment, the doses of a plurality of successive figure patterns forming an interpolation section may be functionally approximated by the least-squares method, and a dose at each interpolation end point may be determined using the approximation function. Each dose within an interpolation section between two interpolation end points is an interpolated value obtained by a linear expression connecting the two interpolation end points.

For example, the compressing unit 13 approximates the doses of the j-th to (j+3)-th figure patterns using the least-squares method to determine an approximation function U. The compressing unit 13 corrects a dose D1 of the j-th figure pattern and a dose D2 of the (j+3)-th figure pattern, each corresponding to an interpolation end point, to doses D1' and D2', respectively, which are determined from the approximation function U. The doses of the (j+1)-th and (j+2)-th figure patterns within an interpolation section can be determined by linear interpolation between the doses D1' and D2'.

In the third embodiment described above, the header portion has 1 bit for distinction only between an interpolation end point and a point within an interpolation section. Alternatively, the header portion may have 2 bits, and the dose information may be converted to a data structure composed of a header portion and a value portion as in Table 4 below.

TABLE 4

| Header (2 Bits) | | |
|---|---|---|
| Value | Meaning | Value Portion |
| 00 | Interpolation End Point (Full Bit) | Unsigned 10 Bits |
| 01 | Interpolation End Point Difference Representation | Difference Representation from preceding interpolation end point (Signed 6 Bits) |
| 10 | Within Interpolation Section | None (0 Bit) |
| 11 | Zero | None (0 Bit) |

FIG. 17 illustrates an example of conversion of representation (data compression) of dose information performed by the compressing unit 13. In FIG. 17, doses before compression and value portions after compression are in decimal representation for convenience of description, but they are actually in binary representation.

The dose of the j-th figure pattern and the dose of the (j+3)-th figure pattern each correspond to an interpolation end point and have "00" as the header portion. When the doses of the j-th to (j+3)-th figure patterns are functionally approximated by the least-squares method, the dose of the j-th figure pattern, 606, is approximated to 608, and the dose of the (j+3)-th figure pattern, 565, is approximated to 566. The corrected dose is defined as the value portion of the dose information of each of the j-th figure pattern and the (j+3)-th figure pattern.

Since the dose information of each of the (j+1)-th and (j+2)-th figure patterns is within an interpolation section, the representation is converted only to a 2-bit header "10".

The difference between the dose of the (j+4)-th figure pattern and the dose of the (j+3)-th figure pattern corresponding to an interpolation end point is less than or equal to 32 shades of gray. Therefore, the header portion of the dose of the (j+4)-th figure pattern has "01" indicating that the corresponding value portion is in difference representation, and the value portion has a difference +6 from the dose of the (j+3)-th figure pattern (signed 6 bits).

The difference between the dose of the (j+5)-th figure pattern and the dose of the (j+4)-th figure pattern is less than or equal to 32 shades of gray. Therefore, the header portion of the dose of the (j+5)-th figure pattern has "01" indicating that the corresponding value portion is in difference representation, and the value portion has a difference +1 from the dose of the (j+4)-th figure pattern (signed 6 bits).

Since the dose of each of the (j+6)-th and (j+7)-th figure patterns is 0, the representation is converted only to a 2-bit header "11".

In the example shown in FIG. 17, the data size of the dose information of the eight figure patterns before compression is 10 bits×8=80 bits. After the compression, the data size is 12 bits×2+8 bits×2+2 bits×4=48 bits, and this shows that the data size can be reduced.

In the fourth embodiment, figure patterns to be grouped into an interpolation section may be determined in any manner. For example, doses are functionally approximated by the least-squares method, and doses at interpolation end points are determined using the approximation function to calculate a linear expression connecting the interpolation end points. Then, the dose of each figure pattern is determined by the linear expression, and the root-mean-square (RMS) of an error from the original dose is determined. Within a range where the RMS is less than or equal to a predetermined value, as many figure patterns as possible are grouped into an interpolation section.

Fifth Embodiment

The dose information may be compressed by using only one of the compressing methods of the first to fourth embodiments described above, or by using a plurality of compressing methods and switching from one compressing method to another depending on the group of figures. In the case of using a plurality compressing methods, compressing type identification flags, each indicating a compressing method to be used, are defined in or after figure information.

For example, a compressing type identification flag "00" indicates that the compressing method of the first embodiment is to be used, a compressing type identification flag "01" indicates that the compressing method of the second embodiment is to be used, a compressing type identification flag "10" indicates that the compressing method of the third embodiment is to be used, and a compressing type identification flag "11" indicates that the compressing method of the fourth embodiment is to be used.

The control calculator 211 checks the compressing type identification flag and expands the compressed dose information.

Sixth Embodiment

When format conversion (data conversion) is performed using a data format in optimized representation or normal representation, dose information may be compressed after a plurality of figure patterns are sorted by dose. For example, a plurality of figure patterns may be sorted in descending or ascending order of dose.

Figure 18:
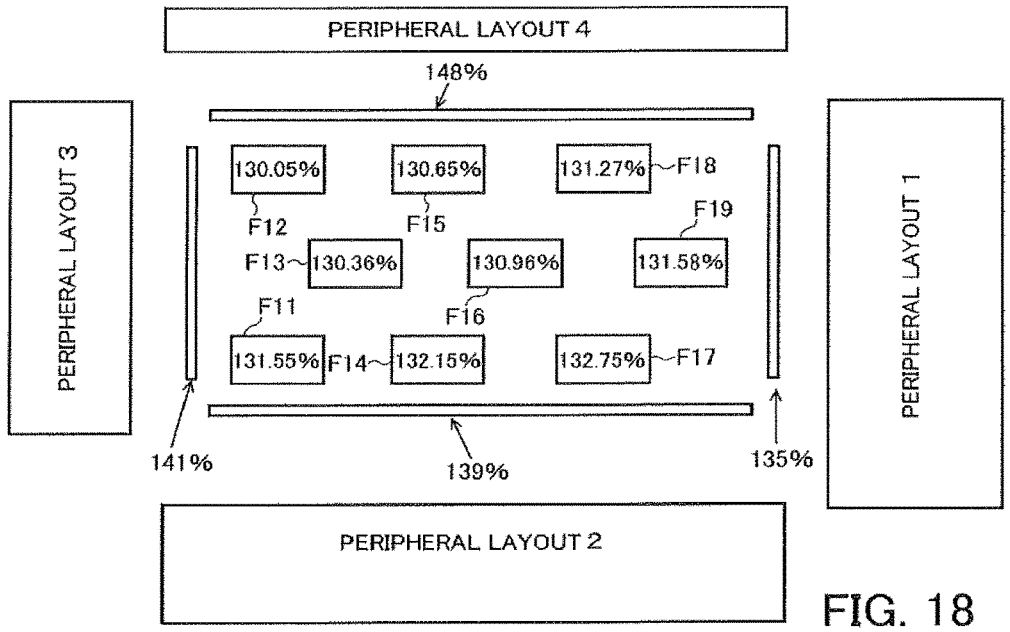
FIG. 18 illustrates a pattern layout in which the amount of dose modulation is defined for each figure.

FIG. 18 illustrates a pattern layout in which the amount of dose modulation is defined for each figure. Compression of dose information of nine figures F11 to F19 in the center of FIG. 18 will be described. The nine figures F11 to F19 are of the same figure type and size, and are not arranged in an array. Table 5 below shows dose modulation rates of figures F11 to F19, which are assigned respective figure numbers 1 to 9. Note that the dose modulation rates are expressed in integers, with a dose modulation rate of 0.01% being taken as 1.

TABLE 5

| FIG. Number | Modulation Rate | Difference From Preceding Dose Modulation Rate |
|---|---|---|
| 1 | 13155 | |
| 2 | 13005 | −150 |
| 3 | 13036 | 31 |
| 4 | 13215 | 179 |
| 5 | 13065 | −150 |
| 6 | 13096 | 31 |
| 7 | 13275 | 179 |
| 8 | 13127 | −148 |
| 9 | 13158 | 31 |

Figure 19:
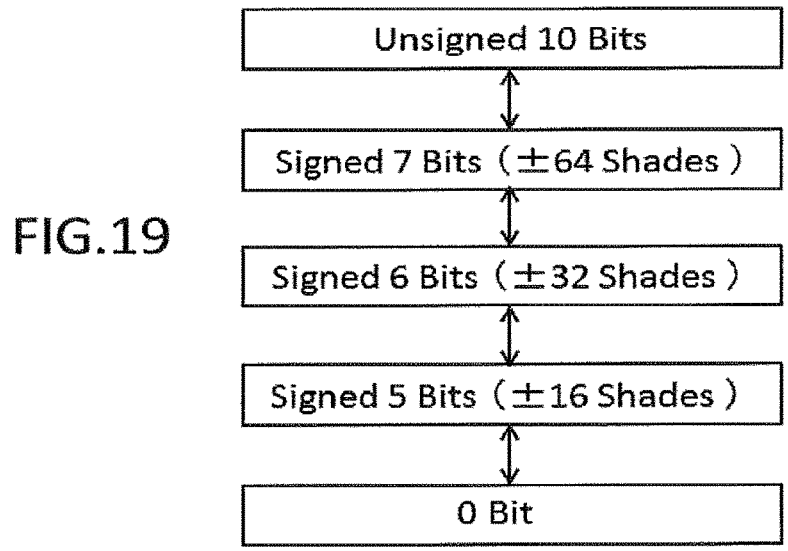
FIG. 19 illustrates a bit increase/decrease template.

Assume that the dose modulation rates are compressed by the compressing method of the second embodiment. A bit increase/decrease template illustrated in FIG. 19 is used. If sorting by dose is not performed, conversion of representation (data compression) of dose information performed by the compressing unit 13 is as shown in FIG. 20A. The data size of the dose modulation rates of the nine figure patterns is 12 bits+12 bits+9 bits+12 bits+12 bits+9 bits+12 bits+12 bits+9 bits=99 bits.

In Table 6 below, figure patterns are sorted in ascending order of dose modulation rate.

TABLE 6

| FIG. Number | Modulation Rate | Difference From Preceding Dose Modulation Rate |
|---|---|---|
| 2 | 13005 | |
| 3 | 13036 | 31 |
| 5 | 13065 | 29 |
| 6 | 13096 | 31 |
| 8 | 13127 | 31 |
| 1 | 13155 | 28 |
| 9 | 13158 | 3 |
| 4 | 13215 | 57 |
| 7 | 13275 | 60 |

When sorting is done by dose modulation rate as shown above, conversion of representation (data compression) of dose information performed by the compressing unit 13 is as shown in FIG. 20(b). The data size of the dose modulation rates of the nine figure patterns is 12 bits+9 bits+8 bits+8 bits+8 bits+8 bits+7 bits+12 bits+9 bits=81 bits.

When sorting is done by dose modulation rate, the number of figure patterns whose dose modulation rates are represented by full bit representation after compression can be reduced, and thus the dose information can be compressed efficiently.

In the example of FIG. 20B, since the difference representation of figure number 9 has signed 5 bits, the dose modulation rate of the succeeding figure number 4 cannot be represented by difference representation and is represented by full bit representation. When, as shown in FIG. 21, the difference representation of figure number 9 has signed 6 bits as in the preceding figure number 1 instead of signed 5 bits, the dose modulation rate of the succeeding figure number 4 can be represented by 7-bit signed difference representation, instead of full bit representation. In the example of FIG. 21, the data size of the dose modulation rates of the nine figure patterns is 12 bits+9 bits+8 bits+8 bits+8 bits+8 bits+9 bits+9 bits=79 bits, and compression can be done more efficiently.

In the compression shown in FIG. 21, the number of figure patterns whose dose modulation rates are represented by full bit representation can be made less than that in the compression shown in FIG. 20B, and thus the amount of data after compression can be further reduced. On the other hand, the compression shown in FIG. 20B can be performed at a higher speed than that shown in FIG. 21.

A high-speed compression mode, such as that shown in FIG. 20B, and a high-compression mode, such as that shown in FIG. 21, may be switched from one to the other.

Although the sixth embodiment has described an example where a plurality of figure patterns are sorted by dose, they may be sorted on the basis of the position (e.g., the position of the center of gravity) of each figure pattern. For example, the figures F11 to F19 illustrated in FIG. 18 may be sorted in order of proximity to the center of the layout. Generally, doses set for respective figure patterns increase with an increasing distance from the center of the layout toward the outer edge. Therefore, when a plurality of figure patterns are sorted in order of proximity to the center of the layout, a result similar to that in the case of sorting in ascending order of dose can be obtained.

The Seventh Embodiment

If the layout data includes a polygonal figure, the converter performs a segmentation process of dividing the polygonal figure into a plurality of trapezoids to generate the write data. Each of the trapezoids generated by the segmentation process has a pair of parallel opposite sides extending in a first direction (e.g., a vertical direction). The trapezoids are connected in a second direction (e.g., a horizontal direction) orthogonal to the first direction. Two adjacent connected trapezoids share the side extending in the first direction as a common side.

For example, as shown in FIG. 22, a polygonal FIG. 300 is divided into a plurality of trapezoids $T_1$ to $T_n$, where n is an integer greater than or equal to two, by a segmentation process. The trapezoids $T_1$ to $T_n$ each have a pair of parallel opposite sides extending in the vertical direction (y direction) and are connected in the horizontal direction (x direction). For example, the trapezoid $T_2$ has a pair of parallel sides $S_1$ and $S_2$. The side $S_1$ is a common side shared with the trapezoid $T_1$ and the side $S_2$ is a common side shared with the trapezoid $T_3$. A side $S_0$ of the trapezoid $T_1$ and a side $S_n$ of the trapezoid $T_n$ at both ends in a connecting direction are not common sides.

Various segmentation processes as illustrated in FIGS. 23A, 23B, 24A to 24D, 25A, 25B, 26A, and 26B are performed depending on the shape of a polygonal figure.

FIG. 23A illustrates a segmentation process performed such that trapezoids each have a pair of parallel opposite sides extending in the vertical direction and are connected in the horizontal direction in a manner similar to FIG. 22. FIG. 23B illustrates a segmentation process performed such that trapezoids each have a pair of parallel opposite sides extending in the horizontal direction and are connected in the vertical direction.

FIG. 24A illustrates a polygonal figure having parallel sides S0 and $S_4$ extending in the vertical direction and a side $S_{x1}$ extending in the horizontal direction and connecting lower ends of the sides $S_0$ and $S_4$. A plurality of trapezoids, generated by a segmentation process, each have a pair of parallel opposite sides extending in the vertical direction and are connected in the horizontal direction such that lower sides of the trapezoids are aligned so as to form a straight line in the horizontal direction.

FIG. 24B illustrates a polygonal figure having parallel sides $S_0$ and $S_4$ extending in the vertical direction and a side $S_{x2}$ extending in the horizontal direction and connecting upper ends of the sides $S_0$ and $S_4$. A plurality of trapezoids, generated by a segmentation process, each have a pair of parallel opposite sides extending in the vertical direction and are connected in the horizontal direction such that upper sides of the trapezoids are aligned so as to form a straight line in the horizontal direction.

FIG. 24C illustrates a polygonal figure having parallel sides $S_0$ and $S_4$ extending in the horizontal direction and a side $S_{y1}$ extending in the vertical direction and connecting right ends of the sides $S_0$ and $S_4$. A plurality of trapezoids, generated by a segmentation process, each have a pair of parallel opposite sides extending in the horizontal direction and are connected in the vertical direction such that right sides of the trapezoids are aligned so as to form a straight line in the vertical direction.

FIG. 24D illustrates a polygonal figure having parallel sides $S_0$ and $S_4$ extending in the horizontal direction and a side $S_{y2}$ extending in the vertical direction and connecting left ends of the sides $S_0$ and $S_4$. A plurality of trapezoids, generated by a segmentation process, each have a pair of parallel opposite sides extending in the horizontal direction and are connected in the vertical direction such that left sides of the trapezoids are aligned so as to form a straight line in the vertical direction.

FIGS. 25A and 25B each illustrate a segmentation process performed such that a polygonal figure has sides extending in the horizontal and vertical directions. In such a case, the polygonal figure is divided into a plurality of oblongs (rectangles). FIG. 25A illustrates a case where the oblongs generated by segmentation are connected in the horizontal direction. FIG. 25B illustrates a case where the oblongs generated by segmentation are connected in the vertical direction.

FIGS. 26A and 26B each illustrate a segmentation process performed such that a polygonal figure has sides extending in the horizontal and vertical directions and sides at an angle of 45° to the vertical direction (or the horizontal direction). FIG. 26A illustrates a case where trapezoids generated by segmentation are connected in the horizontal direction. FIG. 26B illustrates a case where trapezoids generated by segmentation are connected in the vertical direction.

After dividing a polygonal figure into trapezoids, the converter 100 expresses a position of a vertex of each trapezoid by a displacement from a position of a vertex of a neighboring trapezoid to generate write data. For example, in the case illustrated in FIG. 22, the coordinates (x0, y0) of a vertex $P_{01}$ at a lower end of the side $S_0$ is defined as a figure placement position origin of the polygonal figure.

The position of a vertex $P_{02}$ at an upper end of the side $S_0$ is defined by the figure placement position origin $P_{01}$ and a length $L_0$ of the side $S_0$ extending vertically from the origin.

The position of a vertex $P_{11}$ at a lower end of the side $S_1$ parallel to and next to the side $S_0$ is defined by a height (distance between the side $S_0$ and the side $S_1$) $L_1$ of the trapezoid $T_1$ and a displacement $\delta_{11}$ in the vertical direction from the neighboring vertex $P_{01}$. In addition, the position of a vertex $P_{12}$ at an upper end of the side $S_1$ is defined by the height $L_1$ of the trapezoid $T_1$ and a displacement $\delta_{12}$ in the vertical direction from the neighboring vertex $P_{02}$.

The position of a vertex $P_{21}$ at a lower end of the side $S_2$ parallel to and next to the side $S_1$ is defined by a height $L_2$ of the trapezoid $T_2$ and a displacement $\delta_{21}$ in the vertical direction from the neighboring vertex $P_{11}$. In addition, the position of a vertex $P_{22}$ at an upper end of the side $S_2$ is defined by the height $L_2$ of the trapezoid $T_2$ and a displacement $\delta_{22}$ in the vertical direction from the neighboring vertex $P_{12}$.

In other words, the positions of the common vertices $P_{21}$ and $P_{22}$ of the trapezoids $T_2$ and $T_3$ are defined by the displacements $\delta_{21}$ and $\delta_{22}$ in the vertical direction from the positions of the common vertices $P_{11}$ and $P_{12}$ of the trapezoids $T_1$ and $T_2$ and the displacement $L_2$ in the horizontal direction.

Similarly, the position of a vertex $P_{m1}$ at a lower end of a side $S_m$ parallel to and next to a side $S_{m-1}$ is defined by a height (distance between the sides $S_{m-1}$ and $S_m$) $L_m$ of a trapezoid $T_m$ and a displacement $\delta_{m1}$ in the vertical direction from a neighboring vertex $P_{(m-1)1}$, and the position of a vertex $P_{m2}$ at an upper end of the side $S_m$ is defined by the height $L_m$ of the trapezoid $T_m$ and a displacement $\delta_{m2}$ in the vertical direction from a neighboring vertex $P_{(m-1)2}$, where m is an integer ranging from two to n.

As described above, the shape of a connection trapezoid group corresponding to a polygonal figure can be defined based on the coordinates (x0, y0) of the figure placement position origin $P_{01}$, the length $L_0$ of the side $S_0$, the heights $L_1$ to $L_n$ of the trapezoids $T_1$ to $T_n$, and the displacements $\delta_{11}$, $\delta_{12}$ to $\delta_{n1}$, and $\delta_{n2}$ in a direction orthogonal to a trapezoid connecting direction from the neighboring vertices. The displacements $\delta_{11}$, $\delta_{12}$ to $\delta_{n1}$, and $\delta_{n2}$ are signed values. Each of the heights $L_1$ to $L_n$ of the trapezoids $T_1$ to $T_n$ can be regarded as a displacement in the trapezoid connecting direction from the neighboring vertex.

FIG. 27A illustrates an exemplary data structure of write data defining a connection trapezoid group. The write data includes a header PH, a header PHd, and shape information ER In the header PH, a figure code (Code), a flag, and the number of figure elements (N) are defined.

The figure code is information indicating what polygonal figure has been divided into trapezoids connected as a group. For example, the figure code indicates which of the segmentation processes illustrated in FIGS. 23A, 23B, 24A to 24D, 25A, 25B, 26A, and 26B has been performed.

The flag includes information necessary to identify figure representation, for example, the byte length of data included in the shape information EP, which will be described later. The number of figure elements (N) represents the number of connection trapezoid groups (polygonal figures) having the same figure code. The shape information EP is produced for each connection trapezoid group. If the number of figure elements (N) is greater than or equal to two, a plurality of shape information items EP1 to EPN are produced as illustrated in FIG. 27B.

A dose (an amount of radiation) to each of connected trapezoids is defined in the write data. A header PHd includes data indicative of doses $AI_1$ to $AI_n$ to the trapezoids $T_1$ to $T_n$. A flag in the header PHd denotes the byte length of the data indicative of the doses $AI_1$ to $AI_n$. The number of elements "N" in the header PHd denotes the number of trapezoids assigned the doses defined. As illustrated in FIG. 27B, a header PHd is provided for each of the plurality of shape information items EP1 to EPN.

Doses $AI_1$ to $AI_n$ are compressed by one of the compression methods according to the first to fourth embodiments. Since the doses $AI_1$ to $AI_n$ have data length by the bit, padding data is added after dose amount information to make a total data amount of the dose amount information integral multiple of byte. A compression type identifier indicating used compression method can be defined in a Code or flag of the header PHd.

The shape information EP includes information to define the shape of a connection trapezoid group, for example, the coordinates (x0, y0) of the figure placement position origin, the length $L_0$ of the side $S_0$, the heights $L_1$ to $L_n$ of the trapezoids $T_1$ to $T_n$, and the displacements $\delta_{11}$, $\delta_{12}$ to $\delta_{n1}$, and $\delta_{n2}$ in the direction orthogonal to the trapezoid connecting direction from the neighboring vertices. The shape information EP further includes the number of connected trapezoids Nconnect.

For example, the write data representing the connection trapezoid group illustrated in each of FIGS. 23A and 23B has a data structure as illustrated in FIG. 23C. In the figure code, for example, a trapezoid connecting direction and which vertex is a figure placement position origin are defined distinguishably. The number of connected trapezoids Nconnect is four.

The write data representing the connection trapezoid group in each of FIGS. 24A to 24D has a data structure as illustrated in FIG. 24E. In the figure code, for example, the trapezoid connecting direction, which sides of the trapezoids are aligned so as to form a straight line, and which vertex is a figure placement position origin are defined distinguishably. The number of connected trapezoids Nconnect is four. In each of FIGS. 24A to 24D, sides of the connected trapezoids are aligned so as to form a straight line and there is no displacement in the direction orthogonal to the trapezoid connecting direction between adjacent vertices in each of these sides. If the shape information items EP include the same number of connected trapezoids Nconnect, the data amount of the shape information EP in each of FIGS. 24A to 24D is smaller than that in each of FIGS. 23A and 23B.

The write data representing the connection trapezoid group in each of FIGS. 25A and 25B has a data structure as illustrated in FIG. 25C. In the figure code, for example, segmentation into a plurality of oblongs, an oblong connecting direction, and which vertex is a figure placement position origin are defined distinguishably.

Figures 26C, 26D:
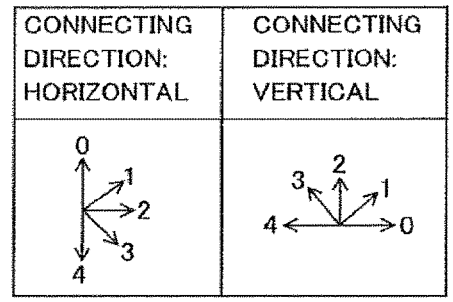
FIG. 26C illustrates a data structure of drawing data.
FIG. 26D illustrates direction flags.

The write data representing the connection trapezoid group in each of FIGS. 26A and 26B has a data structure as illustrated in FIG. 26C. In the shape information EP, a direction flag (flag) is defined as illustrated in FIG. 26D. The reason is as follows: if a polygonal figure has sides extending in the horizontal and vertical directions and sides at 45° to the vertical direction (or the horizontal direction), the sides can be represented by any of the direction flags in FIG. 26D. In the figure code, for example, the trapezoid connecting direction and which vertex is a figure placement position origin are defined distinguishably. FIG. 26C illustrates the write data representing the connection trapezoid group of FIG. 26A.

As described above, a polygonal figure is regarded as a connection trapezoid group consisting of a plurality of trapezoids connected in one direction, only a figure placement position origin is indicated by coordinates, and the position of each of other vertices of the trapezoids is expressed by a displacement from a neighboring vertex to generate the write data. The data amount of the write data can be reduced by compressing the dose of each trapezoid by use of one of the compression methods according to the first to fourth embodiments.

The present invention may be applied not only to a variable shaped electron beam (VSB) drawing apparatus but also to a multi-beam drawing apparatus. Although, in the embodiments described above, a structure in which electron beams are used has been described as an example of charged particle beams, charged particle beams are not limited to electron beams. Other charged particle beams such as ion beams are possible.

While certain embodiments have been described, these embodiments have been presented by way of example only, and are not intended to limit the scope of the inventions.

Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A drawing data generating method for generating drawing data input to a drawing apparatus that draws a plurality of figure patterns on an object using a charged particle beam, the method comprising:
generating the drawing data in accordance with a data format that defines a plurality of pieces of figure information, and sequentially defines dose information of each figure before or after the plurality of pieces of figure information,
wherein the dose information of each of second and succeeding figures is converted to a representation based on the dose information of any preceding figure, and a data length of the dose information is made variable for each figure.

2. The method according to claim 1, wherein the dose information of each of the second and succeeding figures is converted to a difference representation between a dose of the figure and a dose of the immediately preceding figure, and a data length of the difference representation is changed in accordance with the magnitude of a difference value.

3. The method according to claim 1, wherein by referring to a template that defines a stepwise increase or decrease from a data length of dose information of the immediately preceding figure, the dose information of each of the second and succeeding figures is converted to a representation including a value portion indicating a difference from a dose of the immediately preceding figure and a header portion indicating an increase or decrease from the data length of the dose information of the immediately preceding figure.

4. The method according to claim 1, wherein the dose information of the n-th figure, where n is an integer greater than or equal to 2, is converted to a representation indicating that the dose information of the n-th figure is determined by linear interpolation between the dose information of the (n−1)-th or any preceding figure and the dose information of the (n+1)-th or any succeeding figure.

5. The method according to claim 1, wherein the plurality of pieces of figure information include an identifier indicating that same figures are arranged in an array, an identifier indicating a figure type, reference coordinates of the figures arranged in an array, a figure size, a pitch of arrangement, number of figures, and definition order information indicating order of defining dose information of each figure.

6. The method according to claim 1, wherein the plurality of pieces of figure information include an identifier indicating that same figures are repeatedly arranged, an identifier indicating a figure type, number of figures, and figure coordinates of each figure.

7. The method according to claim 6, wherein the dose information of each figure is defined in order of sorting based on the magnitude of dose.

8. The method according to claim 1, wherein the plurality of pieces of figure information include an identifier indicating that figures of same type are repeatedly arranged, an identifier indicating a figure type, number of figures, and figure coordinates and a figure size of each figure.

9. The method according to claim 8, wherein the dose information of each figure is defined in order of sorting based on the magnitude of dose.

10. The method according to claim 1, wherein
a polygonal figure included in design data is divided into a plurality of figure segments including trapezoids each having a pair of parallel opposite sides extending in a first direction, the trapezoids being connected in a second direction orthogonal to the first direction such that adjacent trapezoids share the side extending in the first direction as a common side,
a position of a common vertex of a first trapezoid and a second trapezoid next to the first trapezoid is expressed by a displacement in the first and second directions from a position of a common vertex of the second trapezoid and a third trapezoid next to the second trapezoid, and
dose information of the first trapezoid is converted to a representation based on dose information of a trapezoid preceding to the first trapezoid.

11. The method according to claim 10, wherein dose information of trapezoid is converted to a difference representation between a dose of the trapezoid and a dose of the immediately preceding trapezoid, and a data length of the difference representation is changed in accordance with the magnitude of a difference value.

12. The method according to claim 10, wherein by referring to a template that defines a stepwise increase or decrease from a data length of dose information of the immediately preceding trapezoid, dose information of trapezoid is converted to a representation including a value portion indicating a difference from a dose of the immediately preceding trapezoid and a header portion indicating an increase or decrease from the data length of the dose information of the immediately preceding trapezoid.

13. The method according to claim 10, wherein the dose information of the n-th trapezoid, where n is an integer greater than or equal to 2, is converted to a representation indicating that the dose information of the n-th trapezoid is determined by linear interpolation between the dose information of the (n−1)-th or any preceding trapezoid and the dose information of the (n+1)-th or any succeeding trapezoid.

* * * * *